United States Patent

Tsuchiya

[11] Patent Number: 5,959,359
[45] Date of Patent: Sep. 28, 1999

[54] SEMICONDUCTOR DEVICE WITH A COPPER WIRING PATTERN

[75] Inventor: Yasuaki Tsuchiya, Tokyo, Japan

[73] Assignee: NEC Corporation, Tokyo, Japan

[21] Appl. No.: 08/923,843

[22] Filed: Sep. 4, 1997

[30] Foreign Application Priority Data

Sep. 5, 1996 [JP] Japan .................................. 8-235164

[51] Int. Cl.$^6$ ................................................ H01L 29/43
[52] U.S. Cl. ................................... 257/766; 257/751
[58] Field of Search ............................. 257/751, 766

[56] References Cited

U.S. PATENT DOCUMENTS 5,084,412  1/1992  Nakasaki ................................ 257/762

FOREIGN PATENT DOCUMENTS

| 3119727 | 5/1991 | Japan . |
| 4152696 | 5/1992 | Japan . |
| 6250163 | 9/1994 | Japan . |
| 7109561 | 4/1995 | Japan . |
| 8181147 | 7/1996 | Japan . |
| 1012617 | 1/1998 | Japan . |

OTHER PUBLICATIONS

Mills; "Thermodynamic Relations in the Chromium–Nitrogen System"; 1972; pp. 223–234; Journal of the Less–Common Metal.

Tsuchiya et al; "Mon–stoichiometry and Antiferromagnetic Phase Transition of NaCl–type CrN Thin Films Prepared by Reactive Sputtering"; 1996; pp. 121–129; Materials Transactions, vol. 37, No. 2.

Primary Examiner—David B. Hardy
Attorney, Agent, or Firm—Hayes, Soloway, Hennessey, Grossman & Hage PC

[57] ABSTRACT

In forming a single phase CrN film suitable for a barrier film of the copper wiring, the manufacturing conditions for forming the barrier film are determined in advance. The semiconductor device is manufactured using the predetermined conditions. Single phase CrN film is preferred as a barrier film for preventing diffusion and oxidation of the Cu wiring pattern. For example, a CrN film is formed by sputtering under specific conditions in a mixing gas atmosphere of nitrogen/argon gas. The preferred barrier film for the Cu wiring pattern has a narrow nonstoiciometric composition range of Cr:N=1:0.97–0993.

12 Claims, 10 Drawing Sheets

SEMICONDUCTOR DEVICE WITH A COPPER WIRING PATTERN

BACKGROUND OF THE INVENTION

This invention relates to a semiconductor device having a barrier film for a copper (Cu) film and a method of manufacturing the same.

Recently, high integration and high speed of a semiconductor device are required. Therefore, it is necessary to reduce the width and thickness of the wiring pattern of the semiconductor device. This reduction of the wiring pattern causes an increase in the resistivity of the wiring pattern, resulting in disconnections due to electromigration. Further, the wiring pattern is exposed to a thermal process. This thermal process causes disconnections due to stressmigration. Therefore, it is desired to use wiring patterns without disconnections due to electromigration and stressmigration.

In many cases, an alloy (Al—Si—Cu alloy) containing aluminum as a main component is used as a wiring material. The resistivity of the aluminum alloy is about 3 $\|\Omega$cm, and a melting point is about 650° C. However, this aluminum alloy causes disconnections due to electromigration and stressmigration with high integration.

To avoid this problem, it is preferable to use a wiring material having low resistivity and a high melting point. Copper (Cu) has been proposed as a wiring material having low resistivity and a high melting point. Copper has a resistivity of about 1.67 $\mu\Omega$cm and a melting point of 1083° C. Thus, copper is superior to aluminum alloy in resistivity and melting point.

However, copper is easily oxidized and diffused. Therefore, copper wiring requires a barrier film for preventing oxidation and diffusion. A chromium nitride (CrN) film is effective as this barrier film.

A conventional manufacturing method of a semiconductor device using a CrN film is disclosed in Japanese Unexamined Patent Publication No. H3-119727 (namely, 119727/1991). As will later be described, in accordance with the conventional method, a CrN film is formed by a thermal process in a gas phase. However, the resultant CrN is a mixed crystal which is not suitable for the barrier film, since the mixed crystal comprises lattice defects. Although a single phase CrN film is desirable for the barrier film, if is difficult to form single phase CrN film using the conventional method.

SUMMARY OF THE INVENTION

It is therefore an object of this invention to provide a method of forming a single phase CrN film suitable for a barrier film for copper wiring.

According to this invention, conditions for forming the barrier film are controlled in advance. By employing the predetermined conditions, the semiconductor device is manufactured.

A single phase CrN film is preferable as a barrier film for preventing diffusion and oxidation of Cu wiring. In this invention, for example, a CrN film is formed by sputtering under a specific condition in a mixed gas atmosphere of nitrogen/argon gas. The preferable barrier film for Cu wiring has a narrow nonstoichiometric composition range of Cr:N= 1:0.97–0.993. In particular, single phase CrN film is preferable as the barrier film, since the CrN film effectively prevents diffusion and oxidation of the copper.

In case of forming only single phase CrN by mixed gas sputtering, a nitrogen mixing ratio is an important parameter.

In this invention, the nitrogen mixing ratio for single phase CrN having a nonstoichiometric composition range of bulk CrN is predetermined by widely changing the nitrogen mixing ratio in nitrogen/argon gas mixed atmosphere. Thus predetermined nitrogen mixing ratio is employed in actually manufacturing the semiconductor device. That is, the predetermined nitrogen mixing ratio is used in sputtering of the CrN film so that only a single phase CrN film having a nonstoichiometric composition range of the CrN bulk is formed as the barrier film.

DESCRIPTION OF THE PREFERRED EMBODIMENTS

Referring to FIGS. 1 and 2, a conventional manufacturing method of a semiconductor device will first be described for a better understanding of this invention. The manufacturing method is equivalent to the conventional manufacturing method described in the preamble of the instant specification.

Conventionally, an aluminum alloy is used as a wiring material, while a titanium nitride (TiN) film is used as a barrier film of the wiring.

Figure 1A:
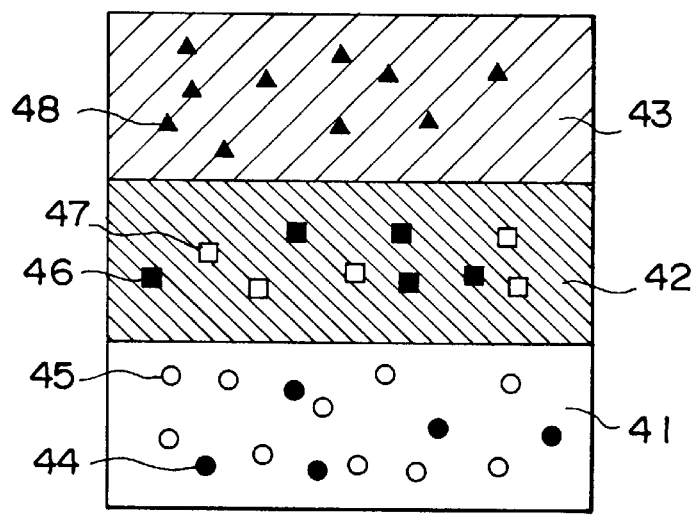
FIGS. 1A and 1B show cross sectional views of the conventional semiconductor devices.
Figure 1B:
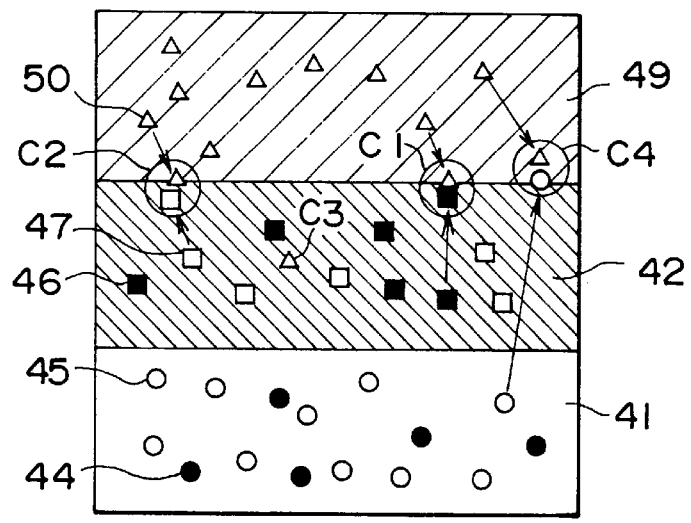

FIG. 1 shows a cross sectional view of a semiconductor device using a TiN film as the barrier film of the wiring. FIG. 1A shows a semiconductor device using an aluminum alloy as the wiring material, while FIG. 1B shows a semiconductor device using copper as the wiring material. In FIG. 1A, a TiN film 42 is formed on an insulating film 41 and further, an aluminum alloy wiring 43 is formed on the TiN film. In FIG. 1B, a TiN film 42 is formed on a insulating film 41 and, a copper wiring 49 is formed on the TiN film 42.

As shown in FIG. 1A, the TiN film is preferable for the barrier film of the aluminum alloy wiring 43, since no diffusion and no oxidation of the aluminum alloy occur via the TiN film. On the other hand, as shown FIG. 1B, the TiN film 42 is not preferable for the barrier film of the copper wiring 49 because diffusion and oxidation of the copper occurs via the TiN film 42.

In FIG. 1B, arrows indicate movements of atoms. Even if the copper wiring 49 is completely covered with the TiN film 42, Cu atoms 50 in the copper wiring 49 are easily diffused to the TiN film 42. The Cu atoms 50 react with N atoms 46 in the TiN film 42 to form each Cu—N compound C1 at an interface, while Cu atoms 50 react with Ti atoms 47 in the TiN film 42 to form each Ti—Cu compound C2 at the interface. Also, a solid solution C3 of the Cu atom 50 is formed in the TiN film. Further, an oxygen (O atom 45) enters from the insulating film 41 to the TiN film 42 to form an oxide copper C4. Thus, in FIG. 1B, the compounds and the solid solution are formed, and thereby the resistivity of the copper wiring 49 is increased. As a result, there is a possibility of electromigration. Therefore, the TiN film is not preferable for the barrier film of the copper wiring.

In the conventional method disclosed in the Japanese Unexamined Patent Publication No. H3-119727, a chromium nitride (CrN) film is used as the barrier film for the copper wiring. Referring to FIG. 2, conventional method will be described below.

Figure 2A:
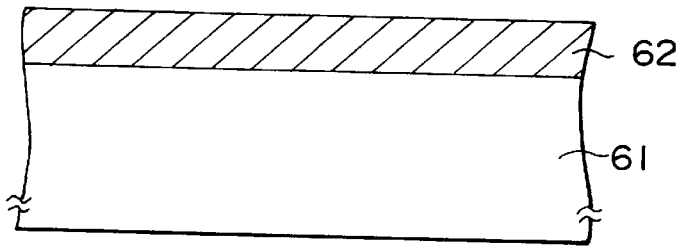
FIGS. 2A through 2D show the conventional method of manufacturing a semiconductor device.

First, as shown in FIG. 2A, an insulating film 62 is deposited on a semiconductor substrate 61.

Figure 2B:
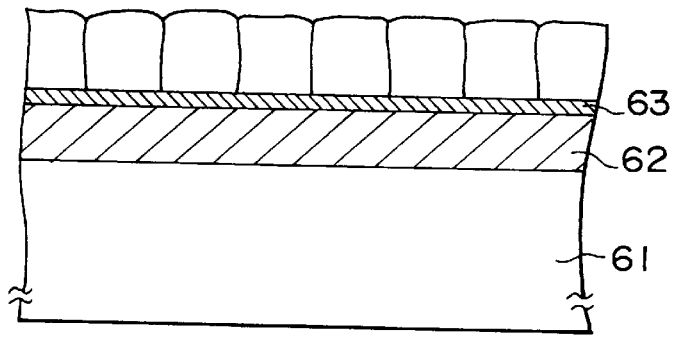

Next, as shown in FIG. 2B, a chromium film 63 is deposited on the insulating film 62 through sputtering. Subsequently, a copper film 64 is deposited by sputtering.

Figure 2C:
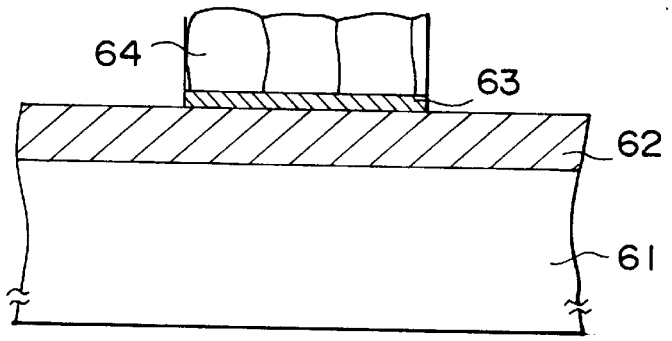

Next, as shown in FIG. 2C, the copper film 64 and the chromium film 63 are etched to form a wiring pattern. Thereafter, a thermal processing is performed in hydrogen/nitrogen mixed gas.

Figure 2D:
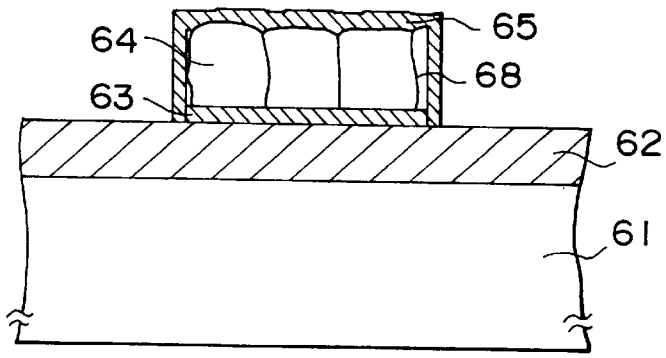

Finally, as shown in FIG. 2D, the surface of the copper film 64 is covered with a CrN film 65. Thus, the wiring formed by the copper film 64 is left on the insulating film 62. The CrN film 65 functions as a barrier film of the copper film 64. That is, the CrN film 65 prevents diffusion and oxidation of the copper film 65.

However, in the conventional manufacturing method, the CrN film 65 (barrier film) is formed by a thermal process in a gas phase. As a result, a mixed crystal of CrN and $Cr_2N$ is formed as the barrier film (T. Mills, J., Less-common Metals, 26 (1972) 223–234). This is mainly because nitrogen content in the vapor phase is not kept constant. The composition of the CrN is sensitive to the nitrogen content in the gas phase. That is, the composition of the CrN film mainly depends on the nitrogen content in the gas phase. If the chromium is sufficiently nitrogenized, a single phase of CrN may be formed. However, depending on the content of the supplied nitrogen, the chemical composition of Cr and N in the CrN film has a variable ratio. Therefore, the resultant CrN film consists of a mixed crystal containing $Cr_2N$. The $Cr_2N$ has a wide nonstoichiometric composition range of Cr:N=1:0.979–0.645. The mixed crystal of the CrN and $Cr_2N$ is not suitable as a barrier film because a large number of lattice defects very often appear in the mixed crystal. This results in diffusion and oxidation of the copper film. A single phase CrN film having a narrow nonstoichiometric composition range CrN=1:0.97–0.993 and having a small number of lattice defects is suitable as the barrier film of the copper wiring. It is possible to use vanadium, niobium, tantalum, molybdenum, and tungsten in place of chromium as metals that form no metal compound with the copper. However, these metals are not desirable for the barrier film for the copper wiring, since these metals are nitrogenized over a wide nonstoichiometric composition range. Further, such conventional method has a disadvantage in that it is difficult to be formed in a contact hole and a via hole. That is, in a conventional method, after chromium is formed in the contact hole, the copper is embedded in the hole. Thereafter, a thermal processing in an atmosphere including nitrogen is performed to nitrogenize the chromium. In this case, nitriding is not sufficiently performed, since nitrogen is not sufficiently introduced into the bottom portion of the contact hole. In particular, where the contact hole is deep, the chromium is not completely nitrogenized at the bottom of the contact hole. Thus, a conventional method is disadvantageous in that the structure of the wiring pattern is restricted, as mentioned above.

Still further, in a conventional method, an organic film can not be used as an interlayer insulating film. Recently, although $SiO_2$ or phosphorus glass is mainly used as an interlayer insulating film, it has been proposed to use an organic film having a small wiring capacitance as the insulating film.

In a conventional method, thermal processing is conducted at a high temperature of 450° C. or more after the chromium film and the copper film are formed on the insulating film. In this case, since thermal processing is conducted at 450° C. or more to precipitate Cr on the surface of the copper, it is impossible to use an organic film having a melting point of 350° C. or less as the interlayer insulating film. Therefore, in a conventional method, it is difficult to use an organic film having a small wiring capacitance as the interlayer insulating film in order to achieve high speed.

Taking the above-mentioned problems into consideration, this invention provides a semiconductor manufacturing method in which single phase CrN film is used as a barrier film. Still further, this invention provides a method in which an organic film is used as a interlayer insulating film.

When copper wiring is used for a semiconductor device, a single phase CrN film is desirable as a barrier film for preventing diffusion of copper atoms of the copper wiring as described above In this invention, a CrN film is formed by sputtering under specific conditions in a mixed gas atmosphere of an inactive gas such as nitrogen, argon gas. The CrN film is directly deposited on a semiconductor substrate.

In case of depositing a substance on a substrate surface in a mixed gas atmosphere by sputtering, a phase of the obtained substance is varied depending on a variety of parameters. As such parameters, there are mentioned temperature and pressure in a chamber, component of atmosphere gas and mixing gas ratio, distance between target and substrate, and sputtering power and so on.

In this invention, conditions for forming the barrier film are controlled in advance, and the composition of the substance obtained by sputtering is measured and analyzed. By employing these conditions, the semiconductor device is actually manufactured. A preferable barrier film for the copper wiring has a narrow nonstoichiometric composition range of Cr:N=1:0.97–0.993. In particular, a single phase CrN film is preferable as the barrier film because the CrN film effectively prevents diffusion and oxidation of the copper. In case of forming only single phase CrN by mixed gas sputtering, a mixing ratio of nitrogen in the gas phase is an important parameter for determining the chemical composition of the CrN film.

Where the nitrogen mixing ratio in the gas phase is varied, the CrN generated from the Cr target through sputtering does not have a nonstoichiometric composition range of bulk CrN. This gives rise to a mixed crystal of CrN and $Cr_2 N$.

In this invention, sputtering is conducted by widely changing the nitrogen mixing ratio in the nitrogen/argon gas mixed atmosphere under conditions for actually manufacturing the semiconductor device. As a result, the nitrogen mixing ratio for single phase CrN having a nonstoichiometric composition range of bulk CrN is determined in advance.

The deposited CrN film is analyzed by powder X-ray diffraction (XRD), composition analysis, and magnetic measurement. The magnetic measurement corresponds to the result of detail studies as to a relation between nonstoichiometric composition of CrN film and antiferromagnetic phase transition (Y. Tsuchiya et al., Materials Transaction, JIM, 37 (1966) 2121–129). The thus-determined nitrogen mixing ratio is employed in actually manufacturing the semiconductor device. That is, a predetermined nitrogen mixing ratio is used in depositing the CrN film through sputtering so that only single phase CrN film having a nonstoichiometric composition range of CrN bulk is formed as the barrier film. Consequently, a CrN barrier film for preventing diffusion of the copper can be obtained. Further, in this invention, the semiconductor device is manufactured in a temperature range of room temperature to about 100° C. without excessively high temperature.

The surface of the semiconductor substrate during sputtering is set to an internal chamber temperature (+5° C. or less). Therefore, the temperature of the substrate surface is set to about 100° C. or less. The organic film used has a melting point of 350° C. or lower. Accordingly, an organic film can be used as the interlayer insulating film in this invention.

Further, this invention can be applied for a variety of wiring pattern configurations and structures because the CrN film is directly deposited by sputtering. In this invention, it is easy to form the barrier film in a contact hole and a via hole.

First Embodiment

The nitrogen mixing ratio necessary to obtain single phase CrN having a nonstoichiometric composition range of a bulk CrN is obtained as follows.

First, a glass substrate is disposed in a chamber of a sputtering apparatus (not shown). After the chamber is preliminarily exhausted, a nitrogen/argon gas mixture is introduced at a total gas flow rate of 30 sccm. In this state, nitrogen mixing ratio PN of nitrogen/argon mixed gas is changed between 10% and 100%. The nitrogen mixing ratio PN is determined by the following formula.

PN=(nitrogen gas flow rate)/(nitrogen gas flow rate+argon gas flow rate)×100.

Thereafter, the temperature in the chamber is maintained at 25° C., while pressure in the chamber is maintained at $5\times10^{-3}$ Torr. Under these conditions, a sputtering is performed by electrical discharge to deposit a CrN film to a thickness of 200 nm.

Figure 3A:
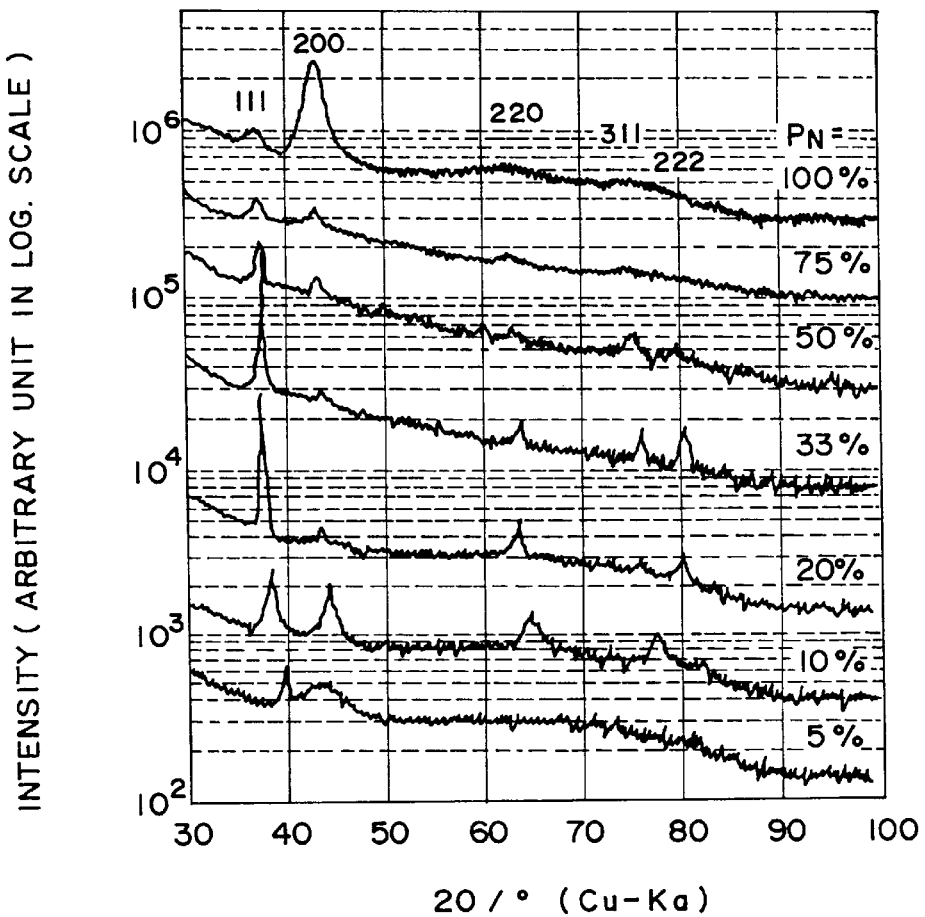
FIG. 3A shows X-ray diffraction patterns in case of changing nitrogen mixing ratio PN.

FIG. 3A shows X-ray diffraction patterns of the deposited film obtained by performing sputtering by changing the nitrogen mixing ratio PN in the range of 5%–100%.

Figure 3B:
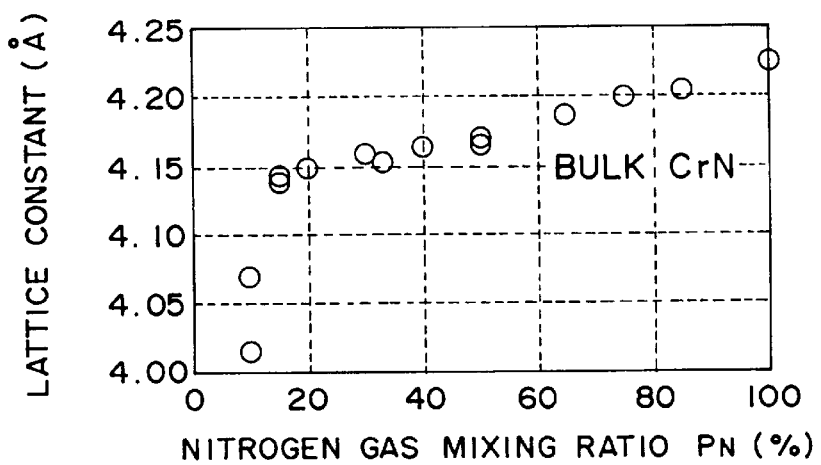
FIG. 3B shows a relation between lattice constant and nitrogen gas mixing ratio PN.

FIG. 3B shows a relation between lattice constant of the CrN and nitrogen gas mixing ratio PN. The lattice constant is determined by the X-ray diffraction patterns shown in FIG. 3A. When the nitrogen mixing ratio is equal to 20%, the lattice constant approximately corresponds to the lattice constant of bulk CrN.

Figure 4:
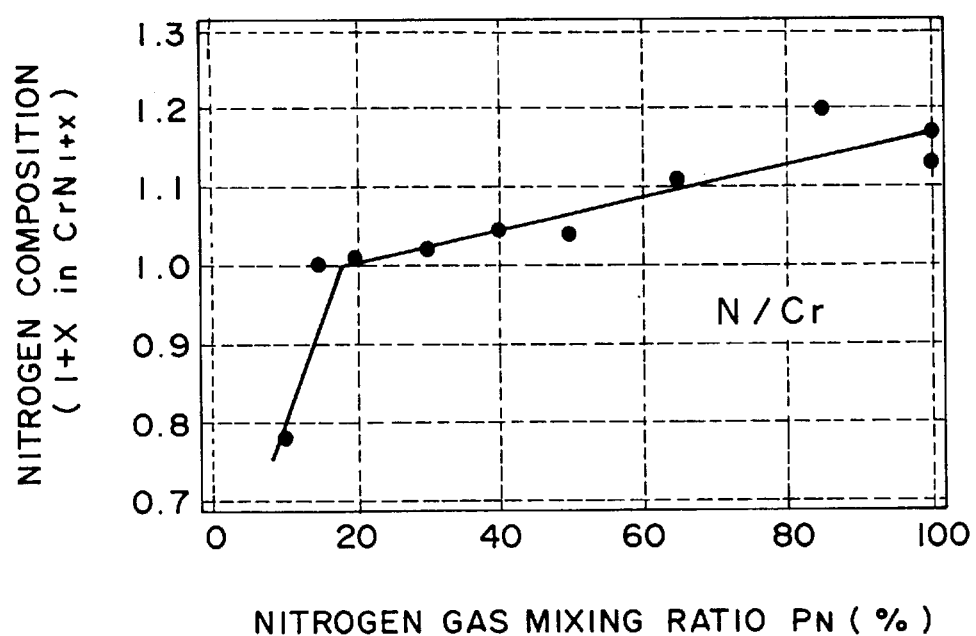
FIG. 4 shows a relation between nitrogen composition and nitrogen gas mixing ratio.

FIG. 4 shows the relationship between composition rate of N/Cr of the deposited film analyzed by Rutherford back scattering spectrometry (RBS) and a nitrogen mixing ratio PN.

It has been found out that the change of lattice constant shown in FIG. 3B depends on a variation of a composition in the CrN nitrogen film. Further, it is found that constant ratio composition is obtained when the nitrogen mixing ratio is 20%. This corresponds to the result of the X-ray diffraction patterns. Further, a sample having nitrogen mixing ratio PN of 20% exhibits the same antiferromagnetic phase transition as bulk CrN by analyzing the deposited film by magnetic measurement. On the other hand, a sample having nitrogen mixing ratio PN other than 20% does not exhibit the same antiferromagnetic phase transition as bulk CrN. The CrN film which is deposited at the nitrogen mixing ratio PN different from 20% does not have the bulk nonstoichiometric composition range. Therefore, the obtained CrN is different from bulk CrN in characteristics.

From the antiferromagnetic phase transition due to the magnetic measurement, it is found that the CrN film having the same composition and nature as bulk CrN can be fabricated under the limited condition. Therefore, composition analysis due to the magnetic measurement using the antiferromagnetic phase transition is very effective The CrN having a nonstoichiometric composition range different from bulk CrN is a quasi-stable phase and has such a trend that the phase is changed to a constant ratio composition by thermal processing. On the other hand, CrN having the nonstoichiometric composition range of bulk CrN does not almost cause composition change and is therefor stable. From the above result, when the nitrogen mixing ratio PN is 20%, single phase CrN having the same composition range as bulk CrN can be obtained.

Thus, the composition of the CrN film can be controlled by changing the nitrogen mixing ratio PN in the nitrogen/argon mixed gas sputtering. As a result, CrN film having the nonstoichiometric composition range of bulk CrN can be obtained.

In a condition different from this case, CrN film having the nonstoichiometric composition range of bulk CrN can be obtained by determining a preferable nitrogen mixing rate PN in advance. For example, when the sputtering power is higher than the 100 W, the depositing rate is increased. Therefore, in order to obtain CrN film having the nonstoichiometric composition range of bulk CrN, the nitrogen mixing ratio PN must be increased to supply sufficient quantity of nitrogen atoms into the depositing film. Also, when the temperature in the chamber is increased, the nitrogen content in the depositing film is reduced. Therefore, the nitrogen mixing ratio PN is made higher than in the depositing condition in a room temperature.

Second Embodiment

FIGS. 5 and 6 show a cross sectional views of a semiconductor device in accordance with the second embodiment of this invention.

Figure 5A:
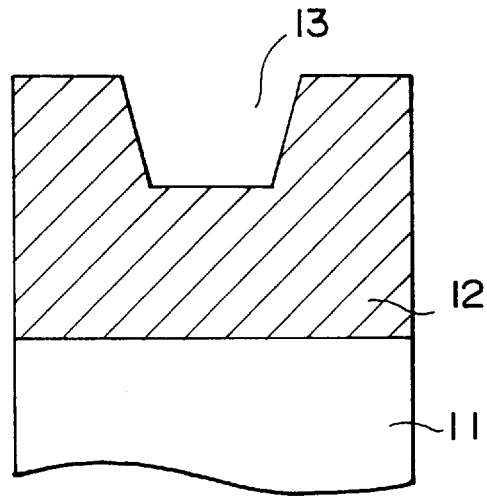
FIGS. 5A through 5C show a method of manufacturing a semiconductor device in accordance with the second embodiment of this invention.

First, as shown in FIG. 5A, an interlayer insulating film 12 of $SiO_2$ is deposited on a semiconductor substrate 11. Thereafter, a groove 13 is formed by etching the interlayer insulating film.

Figure 5B:
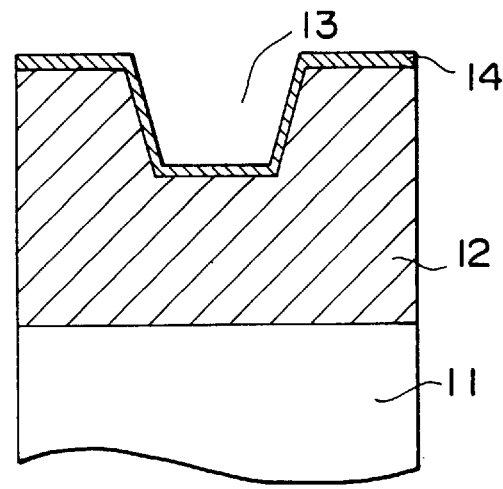

Next, the substrate 11 is placed in a sputtering apparatus (not shown). After preliminarily exhausting the chamber, the nitrogen/argon mixed gas is introduced into the chamber at the mixing ratio of 1/5 (nitrogen mixing ratio=20%) determined in the first embodiment and the total gas flow rate of 30 sccm. Thereafter, the pressure in the chamber is maintained at $5\times10^{-3}$ Torr, while the temperature in the chamber is maintained at 25° C. Under these conditions, electrical discharge is conducted at a power of 100 W, and a CrN film 14 of 50 nm is deposited through sputtering as shown in FIG. 5B.

Figure 5C:
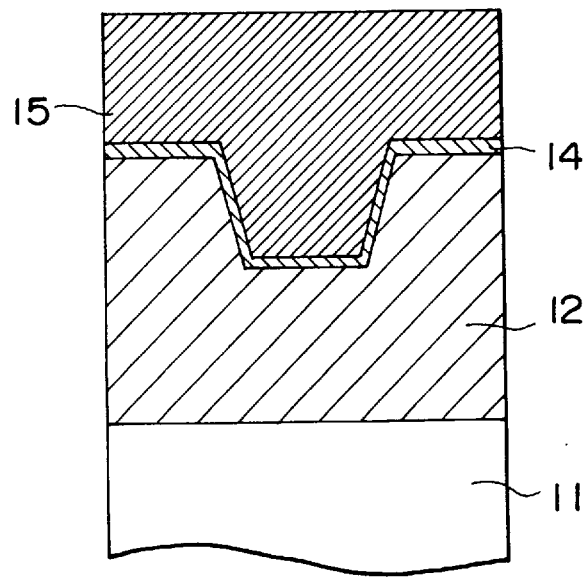

Subsequently, under conditions in which the pressure in the chamber is maintained at $5 \times 10^{-3}$ Torr, electrical discharge is conducted at the power of 50 W in an argon atmosphere, and further sputtering is performed by using Cu target to deposit a copper film 15 of 800 nm as shown in FIG. 5C.

Figure 6A:
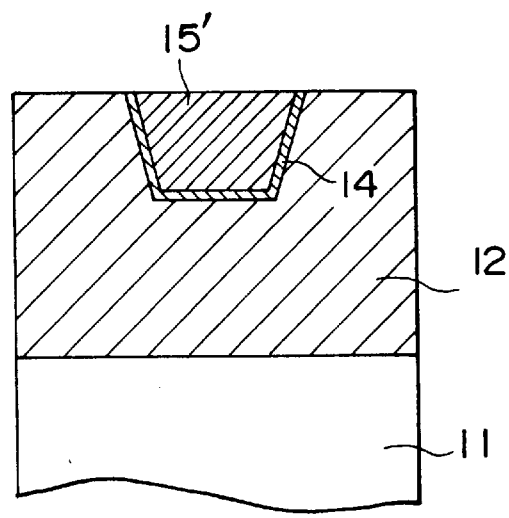
FIGS. 6A through 6C show a method of manufacturing a semiconductor device in accordance with the second embodiment of this invention.
Figure 6B:
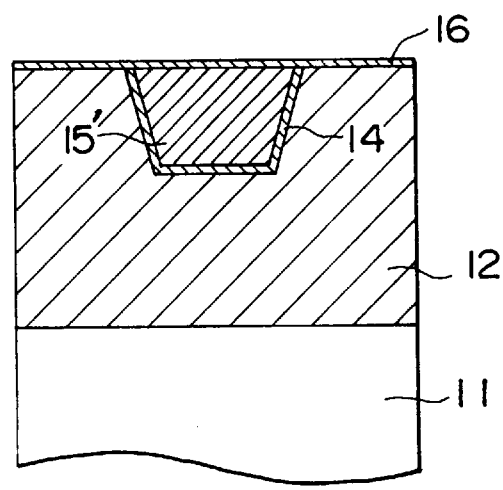

Next, a chemical mechanical polishing (CMP) is performed to obtain a copper wiring pattern 15' using the CrN film 14 as a barrier film as shown in FIG. 6A.

Next, a nitrogen/argon mixed gas in a mixing ratio 1/5 (the nitrogen mixing ratio Pn=20%) is introduced into the chamber at a total gas flow rate of 30 sccm. Thereafter, electrical discharge is performed at chamber pressure of $5 \times 10^{-3}$ Torr and the power of 100 W, and sputtering using a Cr target is carried out to deposit a CrN film 16 on the copper wiring pattern 15' as shown FIG. 6B.

Figure 6C:
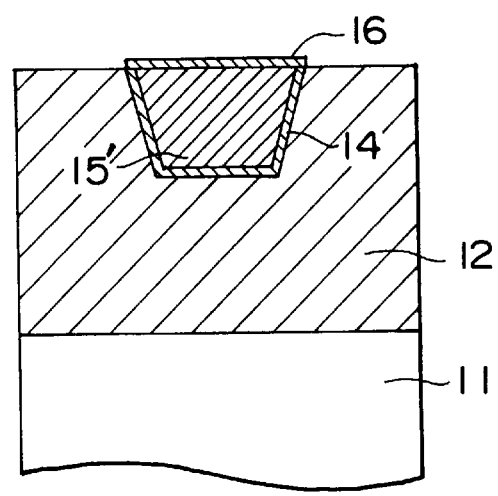

Next, as shown in FIG. 6C, the CrN film 16 on the interlayer insulating film 12 is removed by etching, so that the copper wiring pattern 15' covered with the single phase CrN films 14 and 16 is completed.

Although in this embodiment, the CrN barrier film is formed for the groove wiring, the barrier film may be formed for a lamination type wiring. Since the temperature in the chamber is low (25° C.), a wiring or a barrier film can be formed without effecting an organic film when using an interlayer insulating film of the organic film having a melting point of 350° C. or less.

Third Embodiment

FIGS. 7–10 show cross sectional views of a semiconductor device in accordance with the third embodiment. First, as shown in FIG. 7A, a first interlayer insulating film 22 of an organic film (benzocyclobutene (BCB)) is deposited on a semiconductor substrate 21. Thereafter, a groove 23 for wiring is formed.

Next, the semiconductor substrate 21 is placed in the sputtering apparatus (not shown). After preliminary exhaust, a nitrogen/argon mixed gas is introduced into the chamber at the mixing ratio of 1/5 (the nitrogen mixing ratio=20%) and the total gas flow rate of 30 sccm.

Figure 7A:
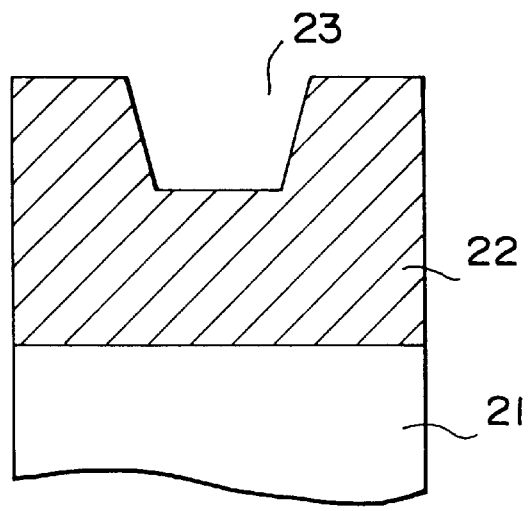
FIGS. 7A through 7C show a method of manufacturing a semiconductor device in accordance with the third embodiment of this invention.
Figure 7B:
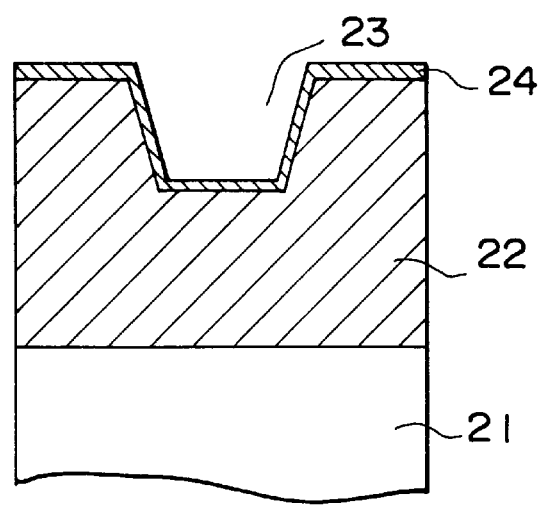

Next, electrical discharge is performed at a chamber pressure of $5 \times 10^{-3}$ Torr, a chamber temperature of 25° C. and power of 100 W, and a CrN film 24 of 50 nm is deposited through sputtering using a Cr target, as shown in FIG. 7B.

Figure 7C:
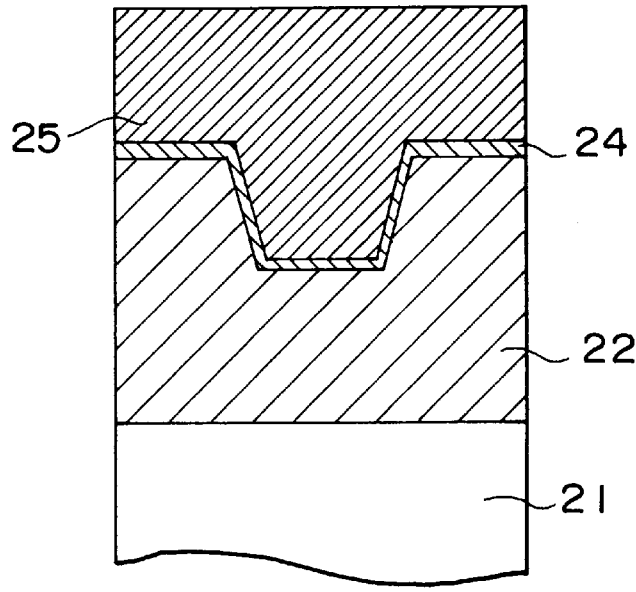

Subsequently, while maintaining the aforesaid chamber pressure, electrical discharge is conducted at an output of 50 W, and a copper film 25 of 800 nm is deposited through sputtering using a Cu target, as shown in FIG. 7C.

Figure 8A:
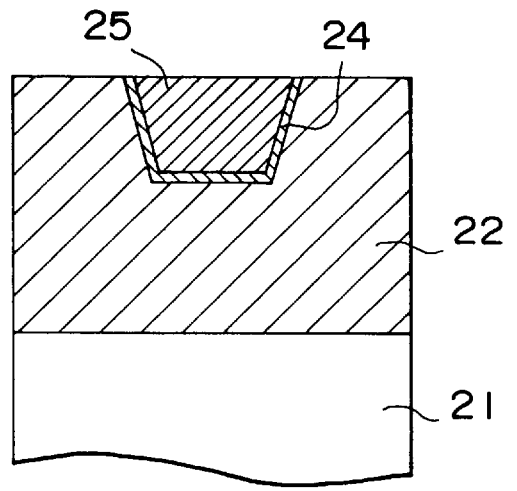
FIGS. 8A through 8C show a method of manufacturing a semiconductor device in accordance with the third embodiment of this invention.

Next, chemical mechanical polishing (CMP) is conducted to produce a copper wiring pattern 25' (first wiring layer) using CrN film 24 as a barrier film as shown in FIG. 8A.

Figure 8B:
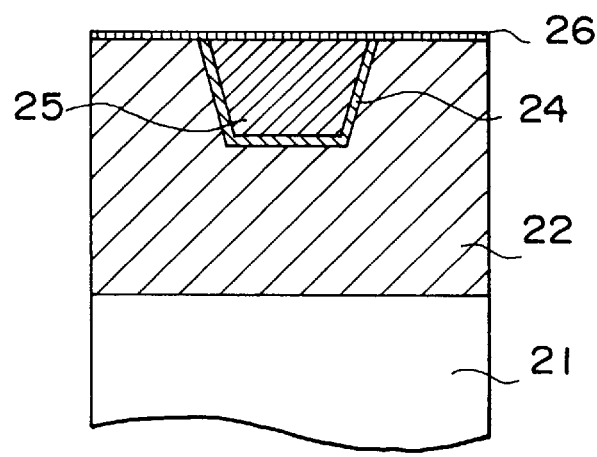
Figure 8C:
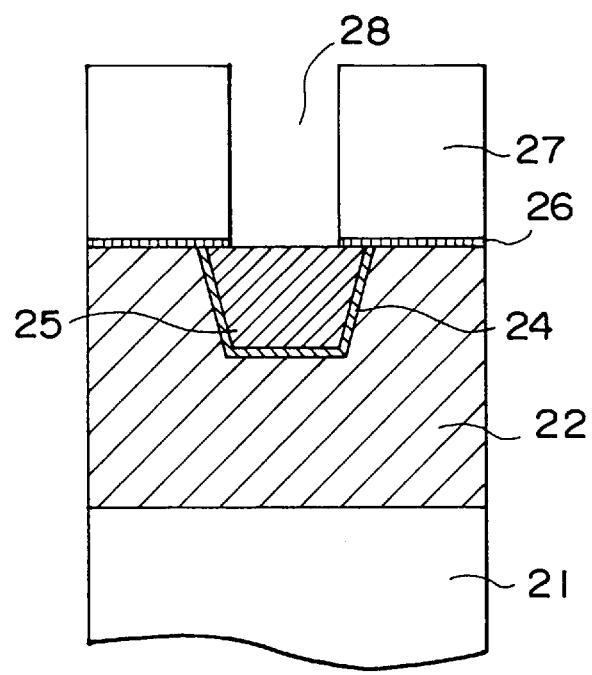

Next, as shown in FIG. 8B, after an oxidation preventing film 26 of SiN is deposited at 50 nm, a second interlayer insulating film 27 (BCB film) is deposited at 1000 nm. Subsequently, as shown in FIG. 8C, a via hole 28 is formed by etching.

Figure 9A:
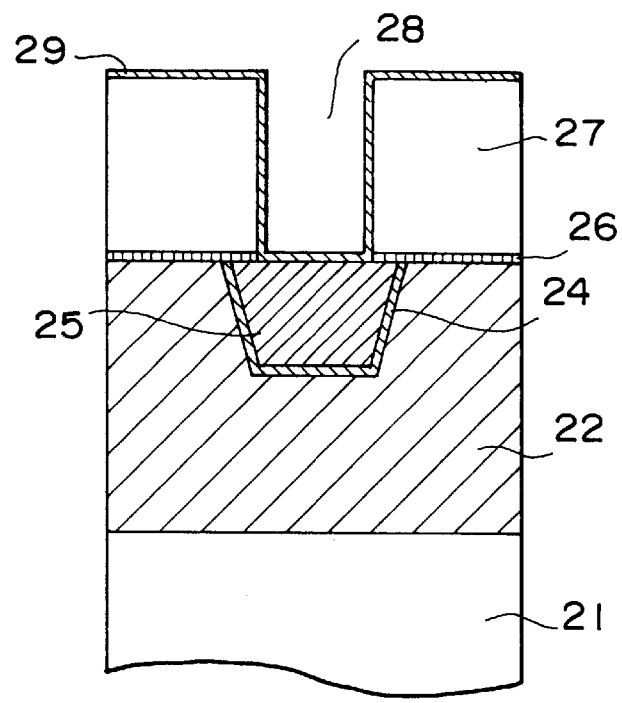
FIGS. 9A and 9B show a method of manufacturing a semiconductor device in accordance with the third embodiment of this invention.

Next, the semiconductor substrate 21 processed in the above-mentioned manner is placed in a sputtering apparatus (not shown). After preliminary exhaust, a nitrogen/argon mixed gas is introduced into the chamber at a mixing ratio of 1/5 (the nitrogen mixing ratio=20%) and total gas flow rate of 30 scam. Thereafter, as shown in FIG. 9A, a CrN film 29 deposited on the second interlayer insulating film (BCB film) 27 and in the via hole 28 by sputtering.

Figure 9B:
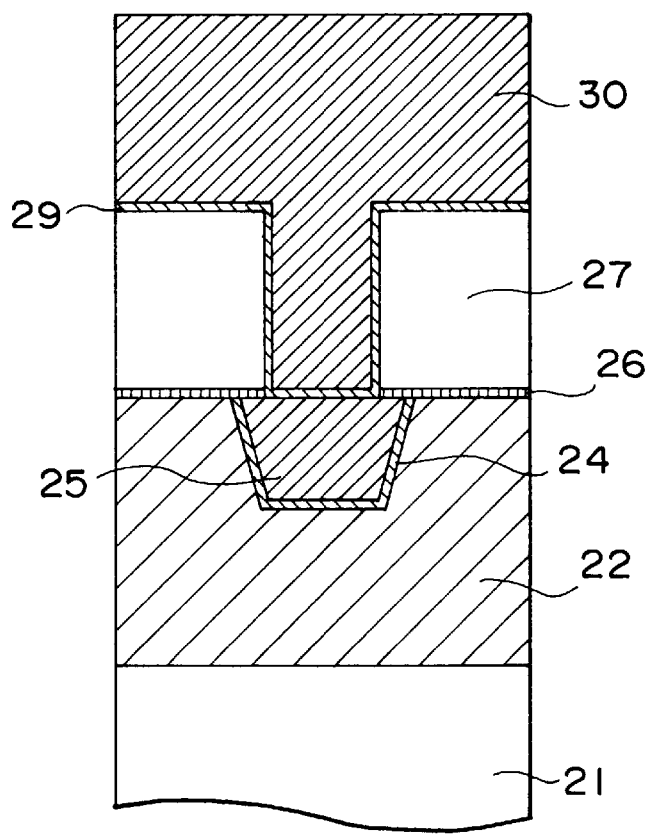

Subsequently, while maintaining the aforesaid chamber pressure, electrical discharge is conducted at the power of 50 W in an argon atmosphere, and a copper film 30 of 800 nm is deposited in the via hole 28 and on the CrN film 29 through sputtering using a Cu target, as shown in FIG. 9B.

Figure 10:
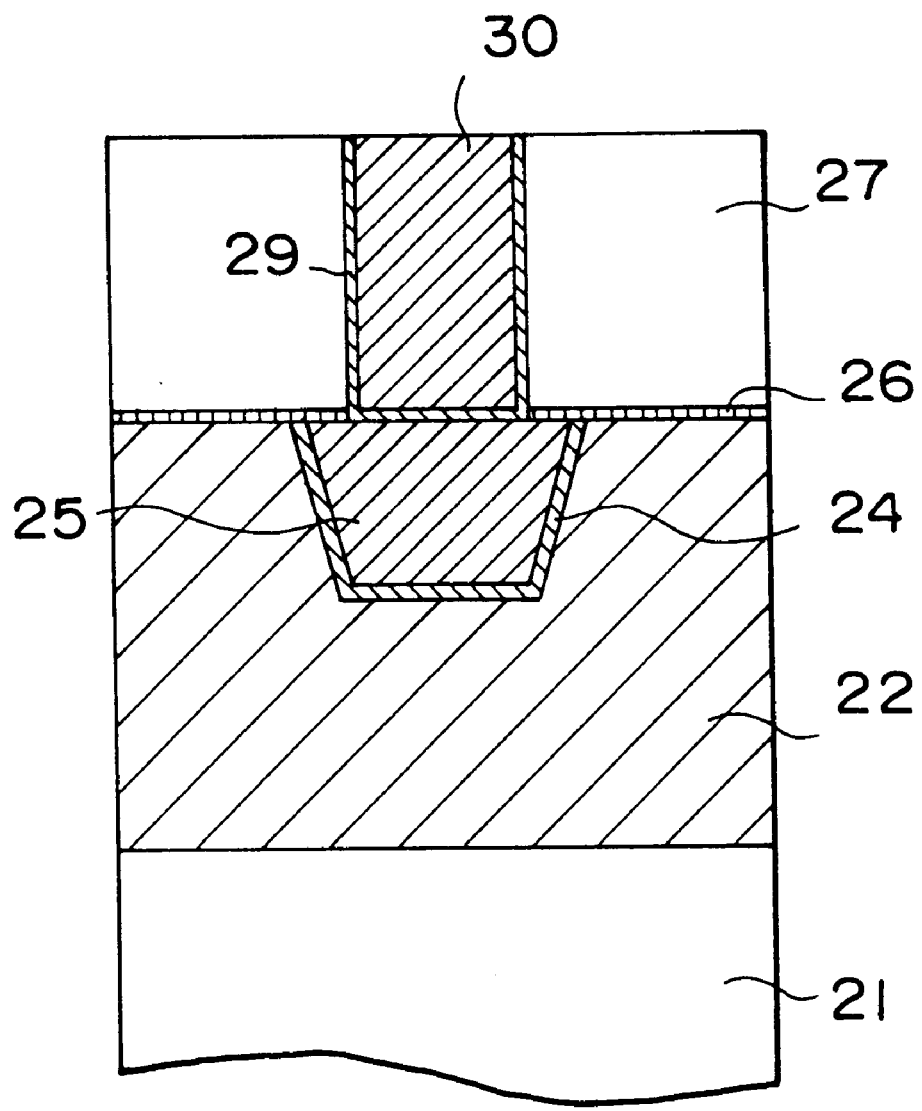
FIG. 10 shows a method of manufacturing a semiconductor device in accordance with the third embodiment of this invention.

Next, chemical mechanical polishing (CMP) is conducted to produce a Cu via 30' using the CrN film as a barrier film as shown in FIG. 10. Thus, the barrier film can be formed in the contact hole and the via hole by directly depositing the CrN film by sputtering. As described in the second and third embodiments, in depositing the CrN film by sputtering, the mixing ratio of the nitrogen/argon mixed gas is 1/5 (the nitride mixing ratio Pn=20%), the total gas flow rate is 30 sccm, the chamber pressure is $5 \times 10^{-3}$ Torr, the chamber temperature is 25° C. and the power is 100 W, respectively. These values are determined in the first embodiment so that the deposited CrN film has the nonstoichiometric composition range of bulk CrN. These values are not fixed. Where the actual conditions are changed, the nitrogen mixing ratio PN (a particularly, important parameter) is changed so that the nonstoichiometric composition range of bulk CrN is obtained. In this case, it is possible that the nitrogen mixing ratio Pn is in the range of 10%–50%.

In the second and third embodiments, although $SiO_2$ and BCB (organic film) is used as interlayer insulating films, SiOF, PSG (Phospho-Silicate Glass), BPSG (Boron Phospho-Silicate Glass), nitride film and the other organic films may be used as insulating films.

Characteristics of the CrN film used in the semiconductor device including the copper wiring pattern fabricated in the second and third embodiments is evaluated.

First, thermal processing at 800° C. in vacuum is performed on the semiconductor device fabricated in the second and third embodiments. Element analysis due to EDX is performed for samples before and after the thermal processing. As a result, no Cu atoms are observed in the CrN barrier film in the samples fabricated in the second and third embodiments. It is thus seen that the CrN barrier film prevents Cu atoms from diffusing from the copper wiring pattern into the CrN barrier film. Further, as a result of the EDX measurement, no oxygen in the Cu film is observed. Therefore, it is thus seen that the CrN barrier film prevents the supply of oxygen from outside and the $SiO_2$ interlayer insulating film.

What is claimed is:

1. A semiconductor device;

a Cu wiring pattern; and a barrier film for said Cu wiring pattern, said barrier film comprising single phase CrN film having a nonstoichiometric composition in the range of Cr:N= 1:0.97–0.993 which is substantially identical with bulk CrN.

2. A semiconductor device having a substrate comprising:

an insulating film formed on said substrate;

a Cu wiring pattern formed inside said insulating film; and a barrier film covering the Cu wiring pattern, said barrier film comprising single phase CrN film having a nonstoichiometric composition in the range of Cr:N= 1:0.97–0.993 which is substantially identical with bulk CrN.

3. A semiconductor device claimed in claim 2, wherein: said insulating film comprises an organic film.

4. A semiconductor device having a substrate comprising;

an insulating film formed over the substrate;

a contact hole formed in said insulating film, said contact hole having an internal surface;

a barrier film formed on the internal surface, said barrier film comprising single phase CrN film having a nonstoichiometric composition in the range of Cr:N= 1.097–0.993 which is substantially identical with bulk CrN; and a Cu wiring pattern formed on said barrier film in said contact hole.

5. A semiconductor device claimed in claim 4, wherein:
said insulating film comprises an organic film.

6. A semiconductor device having a substrate comprising:
a first insulating film formed on said substrate;
a first Cu wiring pattern formed inside said insulating film;
a first barrier film for covering said first wiring, said first barrier film comprising single phase CrN film having a nonstoichiometric composition range which is substantially identical with bulk CrN,
a second insulating film formed on said first insulating film;
a contact hole formed in said second insulating film, said contact hole having an internal surface;
a second barrier film formed on the internal surface, said second barrier film also comprising single phase CrN film; and
a second Cu wiring pattern formed on said second barrier film and in said contact hole.

7. A semiconductor device claimed in claim 6, wherein:
the composition range of said CrN film is represented by Cr:N=1:0.97–0.993.

8. A semiconductor device claimed in claim 6, wherein:
said insulating film comprises an organic film.

9. A semiconductor device having a substrate comprising:
an insulating organic film formed on said substrate;
a Cu wiring pattern formed inside said insulating film; and
a barrier film covering the Cu wiring pattern, said barrier film comprising single phase CrN film having a nonstoichiometric composition range which is substantially identical with bulk CrN.

10. A semiconductor device claimed in claim 9, wherein:
said insulating organic film has a melting point of 350° C. or lower.

11. A semiconductor device having a substrate comprising:
an insulating organic film formed over the substrate;
a contact hole formed in said insulating film, said contact hole having an internal surface;
a barrier film formed on the internal surface, said barrier film comprising single phase CrN film having a nonstoichiometric composition range which is substantially identical with bulk CrN; and
a Cu wiring pattern formed on said barrier film in said contact hole.

12. A semiconductor device claimed in claim 11, wherein:
said insulating film has a melting point of 350° C. or lower.

* * * * *